(12) United States Patent
Chen

(10) Patent No.: US 12,254,952 B2
(45) Date of Patent: Mar. 18, 2025

(54) IMPEDANCE ADJUSTING CIRCUIT WITH CONNECTION DETECTION FUNCTION

(71) Applicant: NANYA TECHNOLOGY CORPORATION, New Taipei (TW)

(72) Inventor: Yu-Wei Chen, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 184 days.

(21) Appl. No.: 18/317,942

(22) Filed: May 16, 2023

(65) Prior Publication Data
US 2024/0386920 A1    Nov. 21, 2024

(51) Int. Cl.
*G11C 7/10* (2006.01)
*H03K 19/00* (2006.01)

(52) U.S. Cl.
CPC ....... *G11C 7/1048* (2013.01); *H03K 19/0005* (2013.01); *G11C 2207/2254* (2013.01)

(58) Field of Classification Search
CPC .......... G11C 7/1048; G11C 2207/2254; G11C 7/1057; H03K 19/0005
See application file for complete search history.

(56) References Cited

U.S. PATENT DOCUMENTS

| | | | |
|---|---|---|---|
| 10,693,460 B1* | 6/2020 | Takahashi | G11C 11/4093 |
| 12,143,084 B1* | 11/2024 | Chen | H03H 11/28 |
| 2011/0115509 A1* | 5/2011 | Kim | G01R 31/3185 |
| | | | 324/750.3 |
| 2015/0248924 A1* | 9/2015 | Priel | G11C 7/1093 |
| | | | 327/564 |
| 2022/0148630 A1* | 5/2022 | Kavala | H03K 19/0005 |
| 2024/0305275 A1* | 9/2024 | Tsai | H03H 11/28 |

FOREIGN PATENT DOCUMENTS

| | | | | |
|---|---|---|---|---|
| CN | 108139996 | | 6/2018 | |
| CN | 110060727 A | * | 7/2019 | G11C 29/028 |
| CN | 110070905 A | * | 7/2019 | G11C 29/50 |
| CN | 114765040 | | 7/2022 | |
| KR | 20210099862 A | * | 8/2021 | C11C 7/1012 |

OTHER PUBLICATIONS

"Office Action of Taiwan Counterpart Application", issued on Sep. 27, 2024, p. 1-p. 6.

* cited by examiner

*Primary Examiner* — Seokjin Kim
(74) *Attorney, Agent, or Firm* — JCIPRNET

(57) ABSTRACT

An impedance adjusting circuit is provided. The impedance adjusting circuit of the disclosure includes a sensing node, a pull-up impedance generator, a zero quotient (ZQ) calibrating circuit and a controller. The pull-up impedance generator is coupled between an external voltage and the sensing node. The controller enables a detecting mode in response to a detecting command, and detect a sensing voltage on the sensing node in the detecting mode. When the sensing voltage is in a default voltage range, the controller controls the ZQ calibrating circuit to perform a ZQ calibrating operation on the pull-up impedance generator. When the sensing voltage is out of the default voltage range in the detecting mode, the controller provides a trimming command to the ZQ calibrating circuit. The ZQ calibrating circuit provides a build-in trim code to the pull-up impedance generator in response to the trimming command.

14 Claims, 3 Drawing Sheets

IMPEDANCE ADJUSTING CIRCUIT WITH CONNECTION DETECTION FUNCTION

BACKGROUND

Technical Field

The disclosure generally relates to an impedance adjusting circuit, and more particularly to an impedance adjusting circuit with a connection detection function.

Description of Related Art

Generally, a memory device operates according to an impedance of a drive capability resistor (RON) or a termination resistor (RTT) of an on-die-termination (ODT) element. For example, an input/output terminal (I/O) voltage (VDDQ) of the memory device may be adjusted by the impedance of the RON or the RTT. In order to increase an accuracy of the impedance of the RON or the RTT memory device includes an impedance adjusting circuit. The impedance adjusting circuit includes a sensing node (or sensing pad) and a pull-up impedance generator coupled to the sensing node. The impedance adjusting circuit performs a zero quotient (ZQ) calibration on the pull-up impedance generator based a sensing voltage on the sensing node. However, when a connection of the sensing node is abnormal, the ZQ calibration may be ineffective. Therefore, the impedance adjusting circuit should be given a connection detection function.

SUMMARY

The disclosure provides an impedance adjusting circuit in a memory device. The impedance adjusting circuit has connection detection function.

The impedance adjusting circuit of the disclosure includes a sensing node, a pull-up impedance generator, a zero quotient (ZQ) calibrating circuit and a controller. The pull-up impedance generator is coupled between an external voltage and the sensing node. The pull-up impedance generator comprises a plurality of pull-up impedance units for providing a resistance value respectively. The ZQ calibrating circuit is coupled to the sensing node and the pull-up impedance generator. The controller is coupled to the sensing node and the ZQ calibrating circuit. The controller enables a detecting mode in response to a detecting command, and detects a sensing voltage on the sensing node in the detecting mode. When the sensing voltage is in a default voltage range in the detecting mode, the controller controls the ZQ calibrating circuit to perform a ZQ calibrating operation on the pull-up impedance generator. When the sensing voltage is out of the default voltage range in the detecting mode, the controller provides a trimming command to the ZQ calibrating circuit. The ZQ calibrating circuit provides a build-in trim code to the pull-up impedance generator in response to the trimming command.

Based on the above, in the detecting mode, the controller of the impedance adjusting circuit detects the sensing voltage on the sensing node. The controller obtains a connections result of the sensing node in the detecting mode. When the sensing voltage is in a default voltage range in the detecting mode, the controller controls the ZQ calibrating circuit to perform a ZQ calibrating operation on the pull-up impedance generator. When the sensing voltage is out of the default voltage range in the detecting mode. The controller provides the trimming command to the ZQ calibrating circuit. Therefore, the impedance adjusting circuit has a connection detection function and provides the operations based on the connections result.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

A disclosure may be understood by reference to the following detailed description, taken in conjunction with the drawings as described below. It is noted that, for purposes of illustrative clarity and being easily understood by the readers, various drawings of this disclosure show a portion of an electronic device, and certain elements in various drawings may not be drawn to scale. In addition, the number and dimension of each device shown in drawings are only illustrative and are not intended to limit the scope of a disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of a disclosure, the corresponding features, areas, steps, operations and/or components would be pointed to existence, but not limited to the existence of one or a plurality of the corresponding features, areas, steps, operations and/or components.

It will be understood that when an element is referred to as being "coupled to", "connected to", or "conducted to" another element, it may be directly connected to the other element and established directly electrical connection, or intervening elements may be presented therebetween for relaying electrical connection (indirectly electrical connection). In contrast, when an element is referred to as being "directly coupled to", "directly conducted to", or "directly connected to" another element, there are no intervening elements presented.

Figure 1:
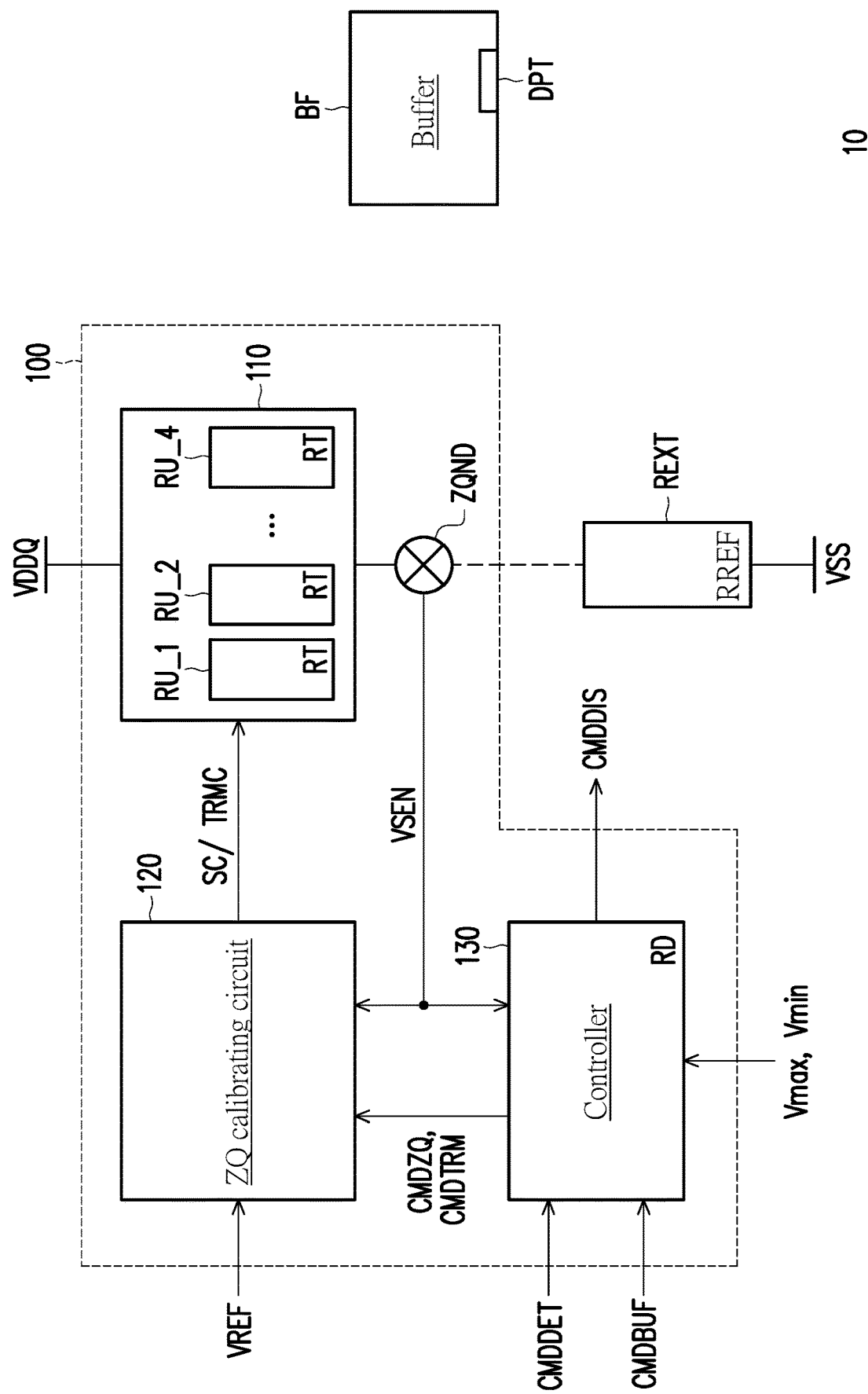
FIG. 1 illustrates a schematic diagram of a memory device according to an embodiment of the disclosure.

FIG. 1 illustrates a schematic diagram of a memory device according to an embodiment of the disclosure. Please refer to FIG. 1, in the embodiment, the memory device 10 at least includes a buffer BF, a reference resistor REXT and an impedance adjusting circuit 100. The buffer BF may be a data (DQ) output buffer, but the disclosure is not limited thereto. In the embodiment, the reference resistor REXT is a precision resistor. The reference resistor REXT has a reference resistance value RREF. The reference resistance value RREF is not variated with variation of voltage and temperature conditions. In other words, the reference resistance value RREF is stable.

The impedance adjusting circuit 100 includes a sensing node ZQND, a pull-up impedance generator 110, a zero quotient (ZQ) calibrating circuit 120 and a controller 130. The sensing node ZQND may be a connecting pad, but the disclosure is not limited thereto. The pull-up impedance generator 110 is coupled between an external voltage VDDQ and the sensing node ZQND. The pull-up impedance generator 110 includes a plurality of pull-up impedance units RU_1 to RU_4. for providing a resistance value respectively. The pull-up impedance units RU1_1 to RU1_4 provide a resistance value RT respectively.

In the embodiment, the ZQ calibrating circuit 120 is coupled to the sensing node ZQND and the pull-up impedance generator. The ZQ calibrating circuit 120 controls the pull-up impedance units RU1_1 to RU1_4 provide respectively the resistance value RT.

The controller 130 is coupled to the sensing node ZQND and the ZQ calibrating circuit 120. The controller 130 enables a detecting mode in response to a detecting command CMDDET. In the detecting mode, the controller 130 detects a sensing voltage VSEN on the sensing node ZQND in the detecting mode.

In the detecting mode, when the sensing voltage VSEN is in a default voltage range RD, the controller 130 controls the ZQ calibrating circuit 120 to perform a ZQ calibrating operation on the pull-up impedance generator 110. When the sensing voltage VSEN is out of the default voltage range RD, the controller 130 provides a trimming command CMDTRM to the ZQ calibrating circuit 120. The ZQ calibrating circuit 120 provides a build-in trim code TRMC to the pull-up impedance generator in response to the trimming command CMDTRM.

In the embodiment, the default voltage range RD is determined by a first reference voltage Vmax and a second reference voltage Vmin. The first reference voltage Vmax is higher than the second reference voltage Vmin. For example, the first reference voltage Vmax is 90% of the external voltage VDDQ, but the disclosure is not limited thereto. The second reference voltage Vmax is 10% of the external voltage VDDQ, but the disclosure is not limited thereto. The reference resistance value RREF is 240 Ohm. The resistance value RT is about 240 Ohm. If the reference resistor REXT is connected between the sensing node ZQND and a low reference voltage VSS, the sensing voltage VSEN is a divided result of the external voltage VDDQ based on the resistance value RT and the reference resistance value RREF. Therefore, the sensing voltage VSEN is in the default voltage range RD.

If the reference resistor REXT is connected between the sensing node ZQND and a low reference voltage VSS, the sensing voltage VSEN is a divided result of the external voltage VDDQ based on the resistance value RT and the reference resistance value RREF. Therefore, the sensing voltage VSEN is in the default voltage range RD.

On the other hand, if the reference resistor REXT is not connected between the sensing node ZQND and the low reference voltage VSS, the sensing voltage VSEN is similar to the external voltage VDDQ when the reference resistor REXT is not connected to the sensing node ZQND. The sensing voltage VSEN is similar to the low reference voltage VSS when the sensing node ZQND is connected to the low reference voltage VSS. Therefore, the sensing voltage VSEN is out of the default voltage range RD.

In the embodiment, when the sensing voltage VSEN is in the default voltage range RD, the controller 130 judges that the reference resistor REXT is connected between the sensing node ZQND and a low reference voltage VSS. Thus, the controller 130 provides the normal ZQ calibrating command CMDZQ to the ZQ calibrating circuit 120. The ZQ calibrating circuit 120 performs the ZQ calibrating operation on the pull-up impedance generator 110 in response to the normal ZQ calibrating command CMDZQ.

In the embodiment, when the sensing voltage VSEN is out of the default voltage range RD, the controller 130 judges that the reference resistor REXT is not connected between the sensing node ZQND and the low reference voltage VSS. Thus, the controller 130 provides a trimming command CMDTRM to the ZQ calibrating circuit 120. The ZQ calibrating circuit 120 provides the build-in trim code TRMC to the pull-up impedance generator 110 in response to the trimming command CMDTRM. The pull-up impedance units RU1_1 to RU1_4 providing the resistance value RT respectively in response to the build-in trim code CMDTRM. In the embodiment, the built-in trim code TRMC may be a code fused in the ZQ calibrating circuit 120. The resistance value RT corresponding to the build-in trim code TRMC is a preset resistance value approximate to the reference resistance value RREF.

It should be noted, in the detecting mode, the controller 130 detects the sensing voltage VSEN on the sensing node ZQND. When the sensing voltage VSEN is in a default voltage range RD, the controller 130 controls the ZQ calibrating circuit 120 to perform a ZQ calibrating operation on the pull-up impedance generator 110. When the sensing voltage VSEN is out of the default voltage range RD. The controller 130 provides the trimming command to the ZQ calibrating circuit. Therefore, the impedance adjusting circuit 110 has a connection detection function and provides the operations based on the connections result.

In the embodiment, when the sensing voltage VSEN is in the default voltage range RD and the controller 130 receives a buffer command CMDBUF, the controller 130 provides the normal ZQ calibrating command CMDZQ to the ZQ calibrating circuit 120. For example, the buffer command CMDBUF may be an external command.

In the embodiment, when the sensing voltage VSEN is out of the default voltage range RD and the controller 130 receives the buffer command CMDBUF, the controller 130 provides the trimming command CMDTRM to the ZQ calibrating circuit 120 and provides a disable command CMDDIS. The memory device 10 disables the buffer BF in response to the disable command CMDDIS.

For example, when the buffer BF is disabled, the buffer BF should be in a high impedance (high-Z) state. If the reference resistor REXT is not connected between the sensing node ZQND and the low reference voltage VSS, the buffer BF is disabled. Thus, a data port DPT of the buffer BF should be floated. Therefore, a connection of the buffer BF could be test when the reference resistor REXT is not connected between the sensing node ZQND and the low reference voltage VSS. For example, if the buffer BF is not in the high impedance (high-Z) state the reference resistor REXT is not connected when the reference resistor REXT is not connected between the sensing node ZQND and the low reference voltage VSS, the connection of the buffer BF is judged as abnormal connection.

In the embodiment, in the ZQ calibrating operation, the ZQ calibrating circuit 120 compares the reference voltage VREF and the sensing voltage VSEN to generate the calibration signal SC. Therefore, the pull-up impedance generator 110 adjusts the resistance value RT in response to the calibration signal SC. For example, the pull-up impedance units RU_1 to RU_4 are calibrated one by one in the ZQ calibrating operation. Thus, the reference voltage VREF is set to half of the external voltage VDDQ (that is, VREF=0.5×VDDQ). For example, all of the pull-up impedance units RU1_ to RU_4 are connected in parallel in the ZQ calibrating operation. Thus, the reference voltage VREF is set to 0.8×VDDQ (that is, VREF=0.8×VDDQ).

In the ZQ calibrating operation, when the sensing voltage VSEN is higher than the reference voltage VREF, the ZQ calibrating circuit 120 adjusts the calibration signal SC. Therefore, the resistance value RT is increased by the calibration signal SC. When the sensing voltage VSEN is lower than the reference voltage VREF, the ZQ calibrating circuit 120 adjusts the calibration signal SC. Therefore, the resistance value RT is decreased by the calibration signal SC. Besides, when the sensing voltage VSEN is equal to the reference voltage VREF, the resistance value RT is equal to the reference resistance value RREF. Thus, the calibration signal SC is not adjusted.

For example, the calibration signal SC has a digital code, but the disclosure is not limited thereto. In the ZQ calibrating operation, the ZQ calibrating circuit 120 adjusts a code value of the digital code of the calibration signal SC when the sensing voltage VSEN is lower than the reference voltage VREF or higher than the reference voltage VREF. For example, the calibration signal SC has a voltage value, but the disclosure is not limited thereto. In the ZQ calibrating operation, the ZQ calibrating circuit 120 adjusts the voltage value of the calibration signal SC when the sensing voltage VSEN is lower than the reference voltage VREF or higher than the reference voltage VREF.

In the embodiment, in the detecting mode, the controller 130 controls the ZQ calibrating circuit 120 to provide a build-in trim code TRMC to the pull-up impedance generator 110 when the sensing voltage VSEN is out of the default voltage range RD. In other words, when the reference resistor REXT is not connected between the sensing node ZQND and the low reference voltage VSS, the controller 130 controls the ZQ calibrating circuit 120 to provide the build-in trim code TRMC to the pull-up impedance generator 110. Therefore, the pull-up impedance units RU1_ to RU_4 provides the resistance value RT respectively in response to the build-in trim code TRMC.

Besides, when the controller 130 is not in the detecting mode, the controller 130 stops detecting the sensing voltage VSEN. The controller 130 allows the ZQ calibrating circuit 120 to perform the ZQ calibrating operation.

Figure 2:
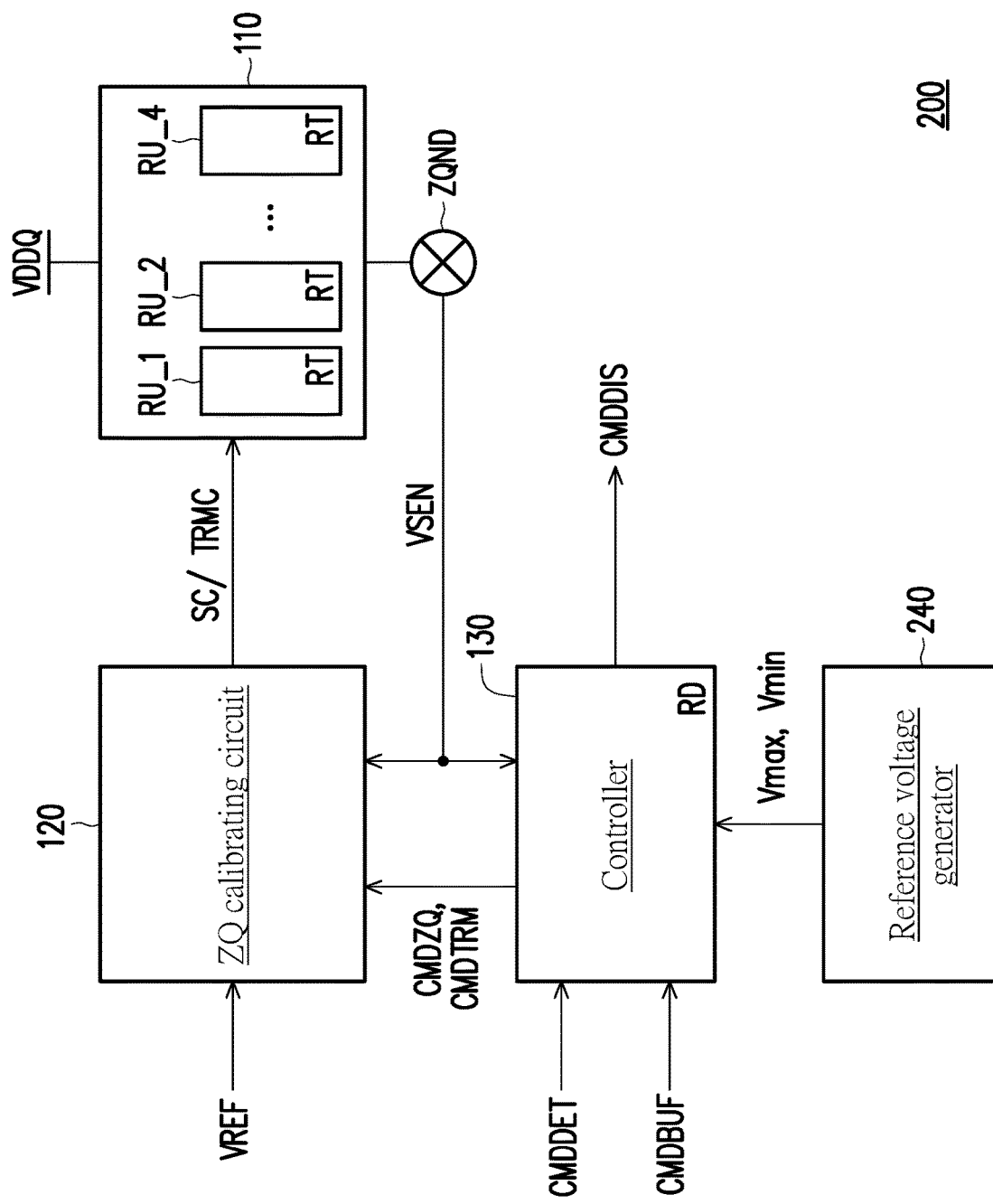
FIG. 2 illustrates a schematic diagram of an impedance adjusting circuit to an embodiment of the disclosure.

FIG. 2 illustrates a schematic diagram of an impedance adjusting circuit to an embodiment of the disclosure. Please refer to FIG. 2, in the embodiment, the impedance adjusting circuit 200 includes the sensing node ZQND, the pull-up impedance generator 110, the ZQ calibrating circuit 120, the controller 130 and a reference voltage generator 240. The operation of the sensing node ZQND, the pull-up impedance generator 110, the ZQ calibrating circuit 120 and the controller 130 have been clearly explained in the embodiments of FIG. 1, so it will not be repeated here.

In the embodiment, the reference voltage generator 240 is coupled to the controller 130. the reference voltage generator 240 generates the first reference voltage Vmax and the second reference voltage Vmin. The reference voltage generator 240 provides the first reference voltage Vmax and the second reference voltage Vmin to the controller 130. The controller 130 determines the default voltage range RD according to the first reference voltage Vmax and the second reference voltage Vmin. In some embodiment, the reference voltage generator 240 may generate the reference voltage VREF.

Figure 3:
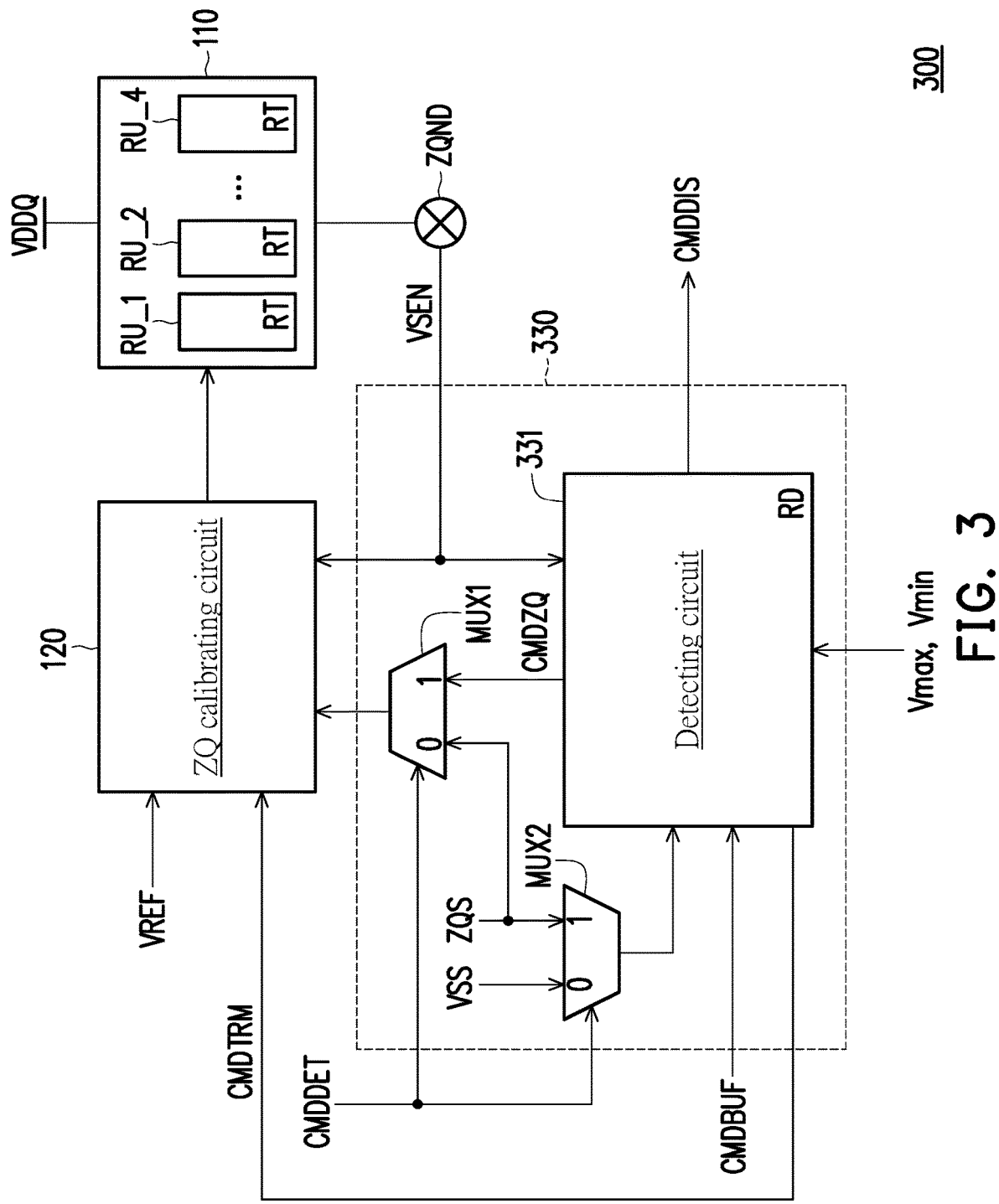
FIG. 3 illustrates a schematic diagram of an impedance adjusting circuit to an embodiment of the disclosure.

FIG. 3 illustrates a schematic diagram of an impedance adjusting circuit to an embodiment of the disclosure. Please refer to FIG. 1 and FIG. 3, in the embodiment, the impedance adjusting circuit 300 includes the sensing node ZQND, the pull-up impedance generator 110, the ZQ calibrating circuit 120 and a controller 330. In the embodiment, the controller 330 includes a detecting circuit 331 and two multiplexers MUX1 and MUX2. The detecting circuit 331 generates a normal ZQ calibrating command CMDZQ. The detecting circuit 331 detects the sensing voltage VSEN in the detecting mode. When the sensing voltage VSEN is in the default voltage range RD, the detecting circuit 331 stops generating the trimming command CMDTRM. On the other hand, when the sensing voltage VSEN is not in the default voltage range RD, the detecting circuit 331 generates the trimming command CMDTRM.

Further, when the sensing voltage VSEN is out of the default voltage range RD and the detecting circuit 331 receives the buffer command CMDBUF, the detecting circuit 331 outputs the disable command CMDDIS in response to the buffer command CMDBUF and generates the trimming command CMDTRM.

In the embodiment, a first input terminal of the multiplexer MUX1 is used to receive the ZQ calibrating starting command ZQS. A second input terminal of the multiplexer MUX1 is used to receive the normal ZQ calibrating command CMDZQ. An output terminal of the multiplexer MUX1 is coupled to the ZQ calibrating circuit 120. A control terminal of the multiplexer MUX1 is used to receive the detecting command CMDDET. For example, the ZQ calibrating starting command ZQS may be an external command. For example, the ZQ calibrating starting command ZQS may be a signal generated by the controller 330 in a default period in the detecting mode.

In the embodiment, a first input terminal of the multiplexer MUX2 is used to receive the low reference voltage VSS. A second input terminal of the multiplexer MUX2 is used to receive the ZQ calibrating starting command ZQS. An output terminal of the multiplexer MUX2 is coupled to the detecting circuit 331. A control terminal of the multiplexer MUX2 is used to receive the detecting command CMDDET.

In the embodiment, the multiplexer MUX1 outputs the ZQ calibrating starting command ZQS to the ZQ calibrating circuit 120 in response to the detecting command CMDDET having a first value. The multiplexer MUX1 outputs the normal ZQ calibrating command CMDZQ to the ZQ calibrating circuit 120 in response to the detecting command CMDDET having a second value. For example, the first value is a logic value "0" (logic low), but the disclosure is not limited thereto. The second value is a logic value "1" (logic high), but the disclosure is not limited thereto.

The multiplexer MUX2 outputs the low reference voltage VSS to the detecting circuit 331 in response to the detecting command CMDDET having the first value. The multiplexer MUX2 outputs the ZQ calibrating starting command ZQS to the detecting circuit 331 in response to the detecting command CMDDET having the second value.

Please refer to FIG. 1, FIG. 3 and Table 1. Table 1 is an operating table for the impedance adjusting circuit 300.

TABLE 1

| State | CMDDET | CMDBUF | VSEN | Detecting mode | ZQ calibrating | CMDTRM | CMDDIS |
|---|---|---|---|---|---|---|---|
| A | 0 | 0 | in default voltage range | Disable | Enable | Disable | Disable |
|   | 0 | 0 | out of default voltage range | Disable | Enable | Disable | Disable |
| B | 1 | 0 | in default voltage range | Enable | Enable | Disable | Disable |
|   | 1 | 0 | out of default voltage range | Enable | Disable | Enable | Disable |
| C | 1 | 1 | in default voltage range | Enable | Enable | Disable | Disable |
|   | 1 | 1 | out of default voltage range | Enable | Disable | Enable | Enable |

In a state "A", a value of the detecting command CMDDET is set as the first value (that is, logic value "0"). The multiplexer MUX2 outputs the low reference voltage VSS to the detecting circuit 331 in response to the detecting command CMDDET having the first value. Therefore, the detecting circuit 331 stops detecting the sensing voltage on the sensing node in response to the low reference voltage VSS. In other words, the detecting circuit 331 disables the detecting mode. Therefore, in the state "A", the detecting circuit 331 enables (or generates) the ZQ calibrating operation and disables (or stops generating) the trimming command CMDTRM.

In the state "A", the multiplexer MUX1 outputs the ZQ calibrating starting command ZQS to the ZQ calibrating circuit 120 in response to the detecting command CMDDET having the first value. Therefore, the ZQ calibrating circuit 120 is allowed to perform the ZQ calibrating operation on the pull-up impedance generator 110 according to the ZQ calibrating starting command ZQS having the second value.

Besides, the detecting circuit 331 disables the detecting mode. Therefore, the detecting circuit 331 disable (or does not output) the disable command CMDDIS.

In a state "B", the value of the detecting command CMDDET is set as the second value (that is, logic value "1"). The multiplexer MUX2 outputs the ZQ calibrating starting command ZQS to the detecting circuit 331 in response to the detecting command CMDDET having the second value. The multiplexer MUX1 outputs the normal ZQ calibrating command CMDZQ from the detecting circuit 331 to the ZQ calibrating circuit 120 in response to the detecting command CMDDET having the second value. A value of the buffer command CMDBUF is set as the first value (that is, logic value "0").

In the state "B", when the ZQ calibrating starting command ZQS has the first value, the detecting circuit 331 stops detecting the sensing voltage VSEN in response to the ZQ calibrating starting command ZQS having the first value.

In the state "B", when the ZQ calibrating starting command ZQS has the second value, the detecting circuit 331 detects the sensing voltage VSEN in response to the ZQ calibrating starting command ZQS having the second value. In other words, the detecting circuit 331 enables the detecting mode in response to the ZQ calibrating starting command ZQS having the second value.

In the state "B", When the sensing voltage VSEN is in the default voltage range RD, the detecting circuit 331 enables the ZQ calibrating operation and disables the trimming command CMDTRM. Therefore, the ZQ calibrating circuit 120 performs the ZQ calibrating operation on the pull-up impedance generator 110. When the sensing voltage VSEN is out of the default voltage range RD, the detecting circuit 331 disables the ZQ calibrating operation and enables the trimming command CMDTRM. Therefore, the ZQ calibrating circuit 120 provides the build-in trim code TRMC to the pull-up impedance generator 110 in response to the trimming command CMDTRM.

Besides, the detecting circuit 331 disable (or does not output) the disable command CMDDIS.

In a state "C", the value of the detecting command CMDDET is set as the second value (that is, logic value "1"). The multiplexer MUX2 outputs the ZQ calibrating starting command ZQS to the detecting circuit 331 in response to the detecting command CMDDET having the second value. The multiplexer MUX1 outputs the normal ZQ calibrating command CMDZQ from the detecting circuit 331 to the ZQ calibrating circuit 120 in response to the detecting command CMDDET having the second value. The value of the buffer command CMDBUF is set as the second value (that is, logic value "1").

In the state "C", when the ZQ calibrating starting command ZQS has the first value, the detecting circuit 331 stops detecting the sensing voltage VSEN in response to the ZQ calibrating starting command having the first value.

In the state "C", when the ZQ calibrating starting command ZQS has the second value, the detecting circuit 331 detects the sensing voltage VSEN in response to the ZQ calibrating starting command ZQS having the second value. In other words, the detecting circuit 331 enables the detecting mode in response to the ZQ calibrating starting command ZQS having the second value.

In the state "C", When the sensing voltage VSEN is in the default voltage range RD, the detecting circuit 331 enables the ZQ calibrating operation and disables the trimming command CMDTRM. Therefore, the ZQ calibrating circuit 120 performs the ZQ calibrating operation on the pull-up impedance generator 110. When the sensing voltage VSEN is out of the default voltage range RD, the detecting circuit 331 disables the ZQ calibrating operation and enables the trimming command CMDTRM. Therefore, the ZQ calibrating circuit 120 provides the build-in trim code TRMC to the pull-up impedance generator 110 in response to the trimming command CMDTRM.

Besides, in the state "C", when the sensing voltage VSEN is out of the default voltage range RD, the detecting circuit 331 enables the disable command CMDDIS and outputs the disable command CMDDIS. Therefore, when the sensing voltage VSEN is out of the default voltage range RD, the buffer is disabled. The connection of the buffer could be tested and detected in the state "C".

In view of the foregoing, the controller of the impedance adjusting circuit detects the sensing voltage on the sensing node. The controller obtains a connections result of the sensing node in the detecting mode. When the sensing voltage is in the default voltage range in the detecting mode, the controller controls the ZQ calibrating circuit to perform a ZQ calibrating operation on the pull-up impedance generator. When the sensing voltage is out of the default voltage range in the detecting mode. The controller provides the trimming command to the ZQ calibrating circuit. Thus, the impedance adjusting circuit has the connection detection function and provides the operations based on the connections result. Besides, when the sensing voltage is out of the default voltage range, the controller outputs the disable command according to the buffer command. Therefore, the connection of the buffer could be tested and detected.

It will be apparent to those skilled in the art that various modifications and variations can be made to the disclosed embodiments without departing from the scope or spirit of the disclosure. In view of the foregoing. it is intended that the disclosure covers modifications and variations provided that they fall within the scope of the following claims and their equivalents.

What is claimed is:

1. An impedance adjusting circuit in a memory device, comprising:
    a sensing node;
    a pull-up impedance generator, coupled between an external voltage and the sensing node, wherein the pull-up impedance generator comprises a plurality of pull-up impedance units for providing a resistance value respectively;
    a zero quotient (ZQ) calibrating circuit, coupled to the sensing node and the pull-up impedance generator; and
    a controller, coupled to the sensing node and the ZQ calibrating circuit, configured to enable a detecting mode in response to a detecting command, and detect a sensing voltage on the sensing node in the detecting mode,
    wherein when the sensing voltage is in a default voltage range in the detecting mode, the controller controls the ZQ calibrating circuit to perform a ZQ calibrating operation on the pull-up impedance generator, and
    wherein when the sensing voltage is out of the default voltage range in the detecting mode, the controller provides a trimming command to the ZQ calibrating circuit, wherein the ZQ calibrating circuit provides a build-in trim code to the pull-up impedance generator in response to the trimming command.

2. The impedance adjusting circuit of claim 1, wherein in the detecting mode:
    when the sensing voltage is in the default voltage range, the controller judges that a reference resistor is connected between the sensing node and a low reference voltage, and
    when the sensing voltage is out of the default voltage range, the controller judges that the reference resistor is not connected between the sensing node and the low reference voltage.

3. The impedance adjusting circuit of claim 1, wherein in the detecting mode:
    when the sensing voltage is in the default voltage range, the controller provides a normal ZQ calibrating command to the ZQ calibrating circuit, and
    the ZQ calibrating circuit performs the ZQ calibrating operation on the pull-up impedance generator in response to the normal ZQ calibrating command.

4. The impedance adjusting circuit of claim 1, wherein each of the plurality of pull-up impedance units providing the resistance value respectively in response to the build-in trim code.

5. The impedance adjusting circuit of claim 1, wherein:
    when the sensing voltage is out of the default voltage range and the controller receives a buffer command, the controller provides the trimming command to the ZQ calibrating circuit and outputs a disable command, and
    the memory device disables a buffer in the memory device in response to the disable command.

6. The impedance adjusting circuit of claim 5, wherein the controller controls the ZQ calibrating circuit to provide a build-in trim code to the pull-up impedance generator when the sensing voltage is out of the default voltage range regardless of receiving the buffer command.

7. The impedance adjusting circuit of claim 5, wherein the controller comprises:
    a detecting circuit, configured to generate a normal ZQ calibrating command,
    wherein the detecting circuit detects the sensing voltage in the detecting mode.

8. The impedance adjusting circuit of claim 7, wherein when the sensing voltage is out of the default voltage range, the detecting circuit outputs the disable command in response to the buffer command.

9. The impedance adjusting circuit of claim 7, wherein the controller further comprises:
    a first multiplexer, wherein a first input terminal of the first multiplexer is used to receive a ZQ calibrating starting command, wherein a second input terminal of the first multiplexer is used to receive the normal ZQ calibrating command, wherein an output terminal of the first multiplexer is coupled to the ZQ calibrating circuit, wherein a control terminal of the first multiplexer is used to receive the detecting command; and
    a second multiplexer, wherein a first input terminal of the second multiplexer is used to receive a low reference voltage, wherein a second input terminal of the second multiplexer is used to receive the ZQ calibrating starting command, wherein an output terminal of the second multiplexer is coupled to the detecting circuit, wherein a control terminal of the second multiplexer is used to receive the detecting command.

10. The impedance adjusting circuit of claim 9, wherein:
    the first multiplexer outputs the ZQ calibrating starting command to the ZQ calibrating circuit in response to the detecting command having a first value, and
    the first multiplexer outputs the normal ZQ calibrating command to the ZQ calibrating circuit in response to the detecting command having a second value.

11. The impedance adjusting circuit of claim 9, wherein:
the second multiplexer outputs the low reference voltage to the detecting circuit in response to the detecting command having a first value, and
the second multiplexer outputs the ZQ calibrating starting command to the detecting circuit in response to the detecting command having a second value.

12. The impedance adjusting circuit of claim 9, wherein:
the detecting circuit stops detecting the sensing voltage on the sensing node and the buffer command in response to the low reference voltage,
the detecting circuit stops detecting the sensing voltage on the sensing node in the detecting mode in response to the ZQ calibrating starting command having the first value, and
the detecting circuit detects the sensing voltage on the sensing node in the detecting mode in response to the ZQ calibrating starting command having the second value.

13. The impedance adjusting circuit of claim 1, wherein:
the default voltage range is determined by a first reference voltage and a second reference voltage, and
the first reference voltage is higher than the second reference voltage.

14. The impedance adjusting circuit of claim 13, further comprising:
a reference voltage generator, coupled to the controller, configured to generate the first reference voltage and the second reference voltage and provide the first reference voltage and the second reference voltage to the controller.

\* \* \* \* \*